United States Patent
Du et al.

(10) Patent No.: US 12,550,574 B2
(45) Date of Patent: Feb. 10, 2026

(54) DISPLAY SUBSTRATE AND DISPLAY DEVICE

(71) Applicant: BOE Technology Group Co., Ltd., Beijing (CN)

(72) Inventors: Xiaobo Du, Beijing (CN); Shu Jing, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 598 days.

(21) Appl. No.: 17/800,022

(22) PCT Filed: Nov. 9, 2021

(86) PCT No.: PCT/CN2021/129587
§ 371 (c)(1),
(2) Date: Aug. 16, 2022

(87) PCT Pub. No.: WO2022/166292
PCT Pub. Date: Aug. 11, 2022

(65) Prior Publication Data
US 2023/0108405 A1    Apr. 6, 2023

(30) Foreign Application Priority Data

Feb. 5, 2021   (CN) .......................... 202110162434.1

(51) Int. Cl.
*H10K 59/35* (2023.01)
*H10K 59/122* (2023.01)
(Continued)

(52) U.S. Cl.
CPC ......... *H10K 59/353* (2023.02); *H10K 59/122* (2023.02); *H10K 59/131* (2023.02); *H10K 59/60* (2023.02)

(58) Field of Classification Search
CPC .. H10K 59/353; H10K 59/131; H10K 59/122; H10K 59/60
(Continued)

(56) References Cited

U.S. PATENT DOCUMENTS

| 2011/0248973 | A1 | 10/2011 | Kuhlman et al. |
| 2013/0056732 | A1* | 3/2013 | Jung ..................... G06F 3/0412 |
| | | | 257/53 |

(Continued)

FOREIGN PATENT DOCUMENTS

| CN | 105679245 A | 6/2016 |
| CN | 108807495 A | 11/2018 |

(Continued)

OTHER PUBLICATIONS

PCT/CN2021/129587 international search report and written opinion.

*Primary Examiner* — Dzung Tran
(74) *Attorney, Agent, or Firm* — IPro, PLLC (57) ABSTRACT

Provided are a display substrate, and a display device. The display substrate includes a base substrate and a plurality of pixel units on the base substrate. Each of the pixel units includes a plurality of sub-pixels, the pixel units include a target pixel unit, the target pixel unit includes target sub-pixels, the target sub-pixel includes a pixel driving circuit and a light-emitting unit capable of emitting light under the drive of the pixel driving circuit, the target sub-pixel further includes a photoresistor, the photoresistor is electrically connected to the pixel driving circuit, and the resistance value of the photoresistor increases as light intensity decreases. According to the present disclosure, the pixel driving circuit includes a photoresistor, and the resistance value of the photoresistor decreases as light intensity increases. As the luminous efficiencies of sub-pixels of different colors under different light intensities are different, (Continued)

the photoresistor is provided to provide different resistance values under different light intensities so to adjust the resistance, and balance the luminous efficiencies of sub-pixels of different colors under different light intensities, thus improving the display effect.

18 Claims, 3 Drawing Sheets

(51) Int. Cl.
*H10K 59/131* (2023.01)
*H10K 59/60* (2023.01)

(58) Field of Classification Search
USPC .......................................................... 257/40
See application file for complete search history.

(56) References Cited

U.S. PATENT DOCUMENTS

| | | | |
|---|---|---|---|
| 2016/0254297 A1* | 9/2016 | Wang | H10D 86/0231 257/43 |
| 2017/0005219 A1* | 1/2017 | Goushcha | H10F 77/1692 |
| 2018/0246598 A1* | 8/2018 | Sainis | G02F 1/1685 |
| 2019/0064621 A1* | 2/2019 | Liu | G02F 1/13318 |
| 2019/0252435 A1* | 8/2019 | Chu | H10F 39/8053 |
| 2019/0302953 A1* | 10/2019 | Lee | H10K 59/40 |
| 2020/0027941 A1 | 1/2020 | Luan et al. | |

FOREIGN PATENT DOCUMENTS

| | | |
|---|---|---|
| CN | 109859693 A | 6/2019 |
| CN | 110556408 A | 12/2019 |
| CN | 112802882 A | 5/2021 |

\* cited by examiner

DISPLAY SUBSTRATE AND DISPLAY DEVICE

CROSS-REFERENCE TO RELATED APPLICATION

This application is the U.S. national phase of PCT Application No. PCT/CN2021/129587 filed on Nov. 9, 2021, which claims Chinese priority No. 202110162434.1 filed on Feb. 5, 2021, the disclosure of which are incorporated in their entirety by reference herein.

TECHNICAL FIELD

The present disclosure relates to the technical field of display, and more particularly, to a display substrate, and a display device.

BACKGROUND

The organic light-emitting diode (OLED) display technology has many advantages such as high brightness, low power consumption, fast response, high definition, and so forth. With the development and maturity of the OLED display technology, OLED display devices are more and more popular.

SUMMARY

In a first aspect, an embodiment of the present disclosure provides a display substrate including a base substrate and a plurality of pixel units on the base substrate, where each of the pixel units includes a plurality of sub-pixels, the pixel units include a target pixel unit, the target pixel unit includes target sub-pixels, the target sub-pixel includes a pixel driving circuit and a light-emitting unit capable of emitting light under the drive of the pixel driving circuit, the target sub-pixel further includes a photoresistor, the photoresistor is electrically connected to the pixel driving circuit, and the resistance value of the photoresistor increases as light intensity decreases.

Optionally, the resistance value of the photoresistor decreases as light intensity increases.

Optionally, the light-emitting unit of the target sub-pixel includes a first electrode, a second electrode, and a light-emitting layer located between the first electrode and the second electrode, and the material of the light-emitting layer includes a phosphorescent light-emitting material.

Optionally, the sub-pixels of the pixel unit include a red sub-pixel, a green sub-pixel, and a blue sub-pixel, and the target sub-pixel includes at least one of a red sub-pixel and a green sub-pixel.

Optionally, the target sub-pixel also includes a blue sub-pixel, wherein under the same light intensity, the resistance value of the photoresistor included in the blue sub-pixel is less than the resistance value of the photoresistor corresponding to the red sub-pixel and the resistance value of the photoresistor corresponding to the green sub-pixel in the same the target pixel unit.

Optionally, the display substrate includes a display area and a non-display area, the display area has a power supply signal line, the power supply signal line extends in a first direction, the power supply signal line has an input end and an output end located in the non-display area, the target pixel unit includes a first target pixel unit and a second target pixel unit, the distance between the first target pixel unit and the input end of the power supply signal line in the first direction is less than the distance between the second target pixel unit and a target edge of the display substrate. Specifically the first target pixel unit includes first target sub-pixels, the second target pixel unit includes second target sub-pixels, the luminous colors of the first target sub-pixel and the second target sub-pixel are the same, and under the same light intensity, the resistance value of the photoresistor corresponding to the first target sub-pixel is greater than the resistance value of the photoresistor corresponding to the second target sub-pixel.

Optionally, the display substrate includes a first display area and a second display area, the distance in the first direction between the first display area and the input end of the power supply signal line is less than the distance between the second display area and the target edge of the display substrate, the pixel units in the first display area are all the first target pixel units, and the pixel units in the second display area are all the second target pixel units.

Optionally, a light-emitting unit of the target sub-pixel includes a first electrode, a light-emitting layer and a second electrode, the first electrode includes a first portion connected to the pixel driving circuit and a second portion connected to the light-emitting layer, the photoresistor is provided integrally with the first electrode, and an orthographic projection of the photoresistor onto the base substrate is separated from an orthographic projection of the first portion onto the base substrate, and the orthographic projection of the photoresistor onto the base substrate is separated from an orthographic projection of the second portion onto the base substrate.

Optionally, the first electrode further includes a third portion, the third portion is located between the first portion and the second portion and is connected to both the first portion and the second portion, the third portion includes a first sub-pattern and a second sub-pattern which are arranged at intervals, the first sub-pattern is connected to the first portion, the second sub-pattern is connected to the second portion, the first sub-pattern and the second sub-pattern are both connected to a photosensitive layer, the resistivity of a photosensitive material of the photosensitive layer increases as light intensity decreases, and the photosensitive layer, the first sub-pattern and the second sub-pattern form the photoresistor.

Optionally, the first sub-pattern includes a plurality of first tooth-shaped structures, the second sub-pattern includes a plurality of second tooth-shaped structures, the first tooth-shaped structures and the second tooth-shaped structures are arranged in a staggered manner, the photosensitive layer is located on a side of the first electrode away from the base substrate, and an orthographic projection of the photosensitive layer onto the base substrate overlaps with an orthographic projection of the first tooth-shaped structures and the second tooth-shaped structures onto the base substrate.

Optionally, the orthographic projection of the photosensitive layer onto the base substrate is separated from an orthographic projection of a part of the first sub-pattern other than the first tooth-shaped structures onto the base substrate, and the orthographic projection of the photosensitive layer onto the base substrate is separated from an orthographic projection of a part of the second sub-pattern other than the second tooth-shaped structures onto the base substrate.

Optionally, the first electrode further includes a fourth portion connected to the first portion and the second portion respectively, and the fourth portion is connected in parallel with the third portion.

Optionally, the display substrate further includes a pixel definition layer located on a side of the first electrode away from the base substrate, and an opaque isolation structure, the isolation structure is arranged in the same layer as the pixel definition layer, and the isolation structure is located on a side of the target sub-pixel corresponding to the photoresistor away from the light-emitting layer of the target sub-pixel.

Optionally, the light-emitting layer of the target sub-pixel includes a first surface close to the base substrate and a second surface away from the base substrate, and an orthographic projection of the first surface onto the base substrate is within an orthographic projection of the second surface onto the base substrate; and the orthographic projection of the second surface onto the base substrate and the orthographic projection of the photoresistor corresponding to the target sub-pixel onto the base substrate have an overlapping area, and the orthographic projection of the first surface onto the base substrate and the orthographic projection of the photoresistor corresponding to the target sub-pixel onto the base substrate are separated.

In a second aspect, an embodiment of the present disclosure further provides a display device including the display substrate of any one in the first aspect.

According to the embodiments of the present disclosure, the pixel driving circuit includes a photoresistor, and the resistance value of the photoresistor decreases as light intensity increases. As the luminous efficiencies of sub-pixels of different colors under different light intensities are different, the photoresistor is provided to provide different resistance values under different light intensities so to adjust the resistance, and balance the luminous efficiencies of sub-pixels of different colors under different light intensities, thus improving the display effect.

BRIEF DESCRIPTION OF THE DRAWINGS

In order to more clearly illustrate the technical solutions of the embodiments of the present disclosure, a brief description will be given below with reference to the accompanying drawings which are required to be used in the description of the embodiments of the present disclosure; it is obvious that the drawings in the following description are only some embodiments of the present disclosure, and it would have been obvious for a person of ordinary skill in the art to obtain other drawings according to these drawings without involving any inventive effort.

DETAILED DESCRIPTION

The embodiments of the present disclosure will now be described more fully hereinafter with reference to the accompanying drawings, in which some, but not all embodiments of the disclosure are shown. Based on the embodiments in the present disclosure, all other embodiments obtained by a person of ordinary skill in the art without inventive effort fall within the scope of the present disclosure.

An embodiment of the present disclosure provides a display substrate.

Figure 1:
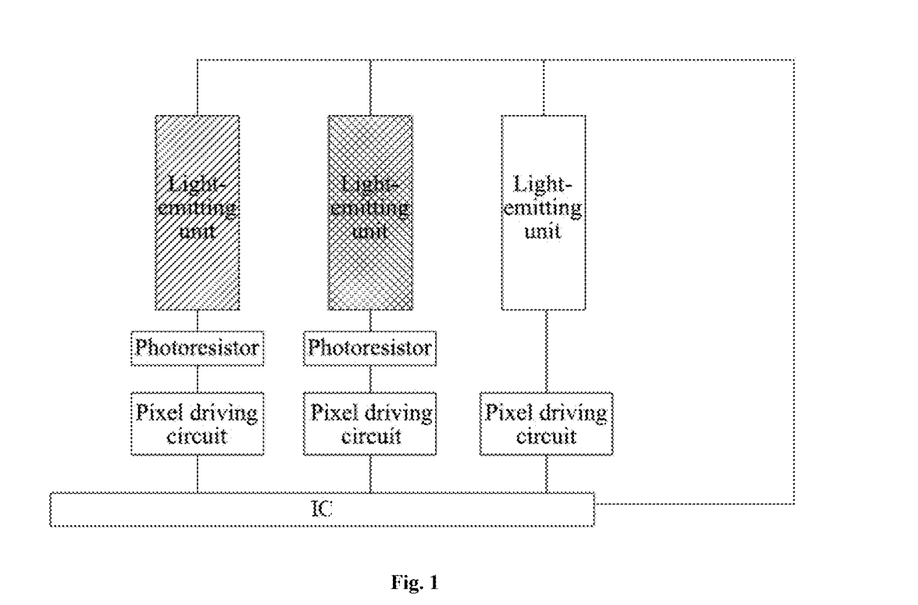
FIG. 1 is a circuit diagram of a target pixel unit in accordance with an embodiment of the present disclosure.

In an embodiment, the display substrate includes a base substrate 401 and a plurality of pixel units on the base substrate 401. As shown in FIG. 1, each pixel unit includes a plurality of sub-pixels, wherein the sub-pixels with different filling effects represent light-emitting units of sub-pixels in different colors.

The pixel unit includes a target pixel unit, the target pixel unit includes target sub-pixels, and the target sub-pixel includes a pixel driving circuit and a light-emitting unit, and the light-emitting unit can emit light under the drive of a control chip (IC) and the pixel driving circuit.

In an embodiment of the present disclosure, the target pixel unit includes a photoresistor 412, the photoresistor 412 is electrically connected to the pixel driving circuit of the target sub-pixel, and the resistance value of the photoresistor 412 increases as light intensity decreases. As the luminous efficiencies of sub-pixels of different colors under different light intensities are different, the photoresistor 412 is provided to provide different resistance values under different light intensities so to adjust the resistance, and balance the luminous efficiencies of sub-pixels in different colors under different light intensities, thus improving the display effect.

Figure 4:
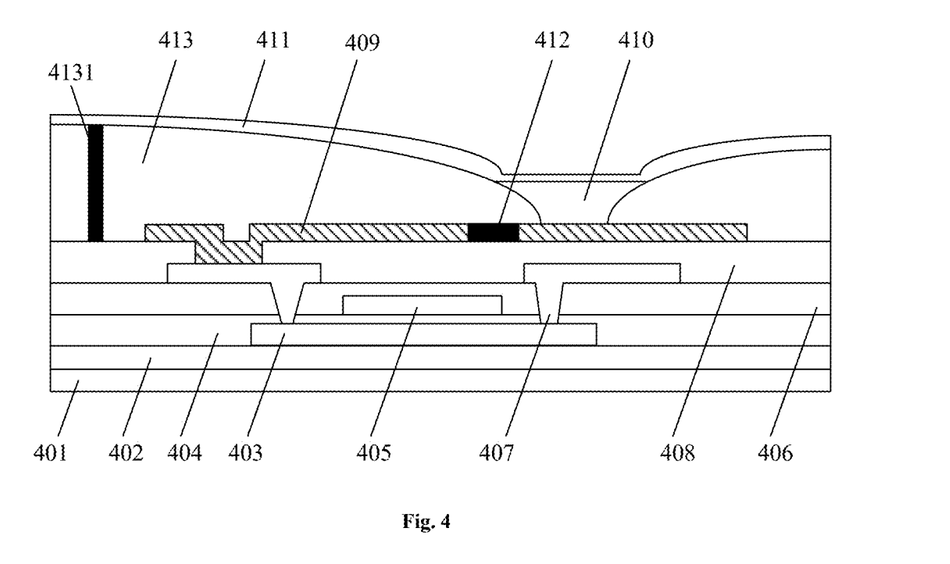
FIG. 4 is a schematic structural diagram of a display substrate in accordance with an embodiment of the present disclosure.

In some embodiments, the light-emitting unit of the target sub-pixel includes a first electrode 409, a second electrode 411, and a light-emitting layer 410 located between the first electrode 409 and the second electrode 411, and the material of the light-emitting layer 410 includes a phosphorescent light-emitting material.

It should be understood that the light-emitting material system of the light-emitting unit mainly includes two kinds of materials, i.e., fluorescent light-emitting materials and phosphorescent light-emitting materials. And since the systems of the materials are different, there is a difference in their electrical effects.

In the process of realizing the technical solution of the present application, Inventors found that the efficiency of a light-emitting unit of a phosphorescent light-emitting material gradually decreases as the current and voltage increase, that is to say, when the voltage decreases, the efficiency of the light-emitting unit of the phosphorescent light-emitting materials would have a significant increase, and this phenomenon is also referred to as efficiency roll-off. However, as the current and voltage increase, the efficiency of the light-emitting unit of the fluorescent light-emitting material does not decrease or increases to a certain extent, and when the voltage decreases and the luminance decreases, the efficiency of the light-emitting unit of the fluorescent light-emitting material does not change significantly.

Based on the above analysis, it can be seen that the change in efficiency of light-emitting units of different material systems is inconsistent with the change in voltage and current.

In the technical solution of this embodiment, the material of the light-emitting layer 410 of the target sub-pixel includes a phosphorescent light-emitting material. In this way, by providing the photoresistor 412, when the driving voltage and the working current increase, the luminance of the light-emitting unit increases, while the resistance value of the photoresistor 412 decreases, which is equivalent to increasing the actual voltage and the actual current, so that the luminous intensity is increased, and the problem that the actual luminous intensity cannot reach the expectation due to the reduced efficiency of the light-emitting unit.

When the driving voltage and the working current decrease, the luminance of the light-emitting unit decreases, and the resistance value of the photoresistor 412 increases, which is equivalent to further reducing the actual voltage and actual current of the light-emitting unit on the basis of the original driving voltage provided by the driving circuit, so as to balance with the working effects of the light-emitting units of other material systems.

In some embodiments, the resistance value of the photoresistor 412 decreases as light intensity increases, so that when the luminance of the target sub-pixel increases, the resistance value of the photoresistor 412 of the target sub-pixel increases accordingly, which increases the actual voltage and actual current of the light-emitting unit to a certain extent, so that the working efficiencies of the sub-pixels included in the target pixel unit are balanced, which helps to improve the display effect.

In some embodiments, the sub-pixels of the pixel unit include a red sub-pixel, a green sub-pixel, and a blue sub-pixel, and the target sub-pixel includes at least one of a red sub-pixel and a green sub-pixel.

Figure 2:
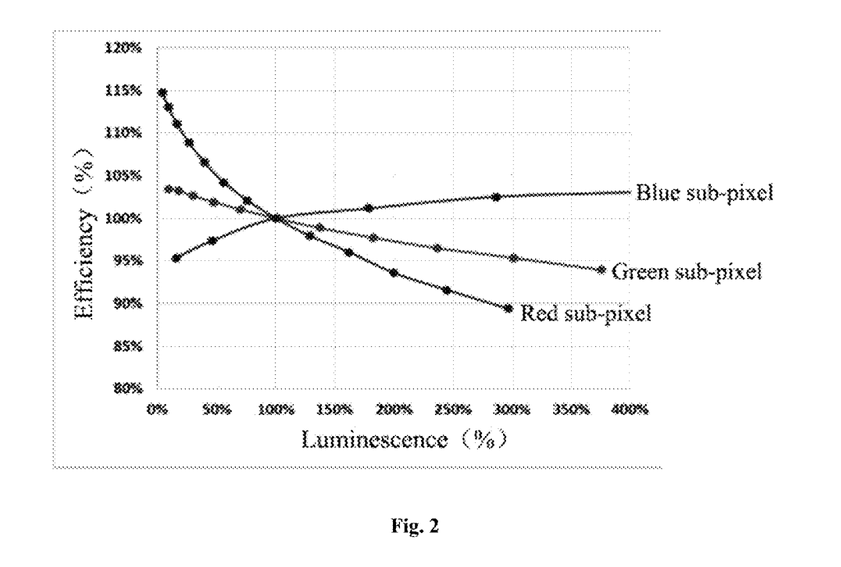
FIG. 2 is a diagram showing the correspondence between current and efficiency of sub-pixels of different colors.
Figure 3:
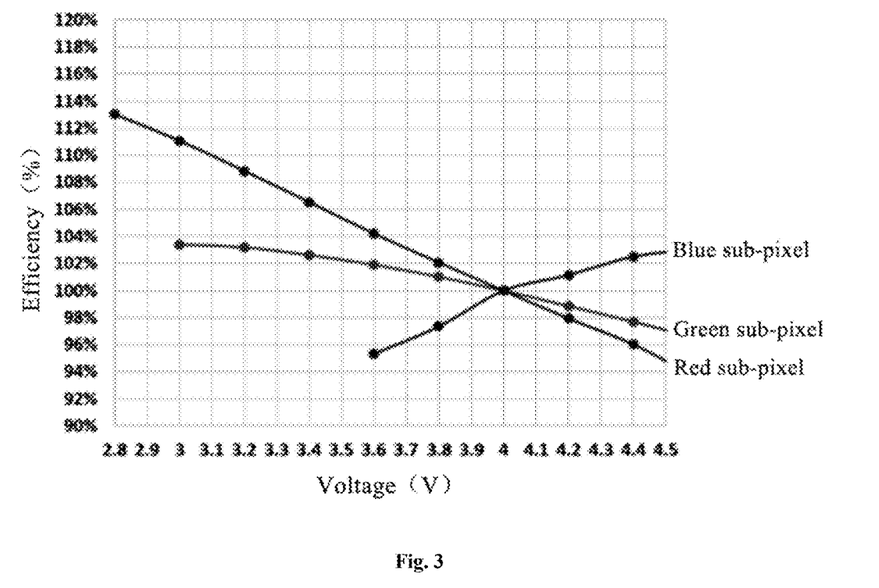
FIG. 3 is a diagram showing the correspondence between voltage and efficiency of sub-pixels of different colors.

As shown in FIGS. 2 and 3, FIG. 2 shows the relationship between luminescence and efficiency of sub-pixels in different colors, where the abscissa is percent current and the ordinate is efficiency, and FIG. 3 shows the relationship between voltage and efficiency of sub-pixels of different colors, where the abscissa is in volts and the ordinate is in percent.

The light-emitting units of the red sub-pixels and the green sub-pixels generally use a phosphorescent light-emitting material, and the light-emitting units of the blue sub-pixels uses a fluorescent light-emitting material. Therefore, the red sub-pixels and the green sub-pixels may have a roll-off phenomenon, and the roll-off phenomenon of the red sub-pixels is more obvious. It can be seen from the above-mentioned analysis combined with FIGS. 2 and 3 that, at a low gray scale, the efficiency of red sub-pixels increases significantly when the luminance decreases, so as to gradually increase the proportion of the luminance of red light in white light and gradually decrease the proportion of blue light as the voltage decreases, that is to say, the actual display effect is red at a low gray scale and appears blue at a high gray scale.

In this embodiment, by using the red sub-pixel and the green sub-pixel as the target sub-pixel and providing the photoresistor 412, the roll-off phenomenon that may occur in the red sub-pixel and the green sub-pixel can be reduced to help balance the display effect.

It should be understood that the efficiency of a device can be understood as a ratio of luminance to current, i.e. efficiency=luminance/current, further, current=voltage/resistance, and therefore, it can be roughly considered that efficiency=luminance resistance/voltage, i.e. luminance/voltage=efficiency/resistance.

If it is required that the variation trend of luminance of sub-pixels of different colors is consistent with voltage, the variation trend of efficiency with resistance needs to be consistent. The efficiencies of the red sub-pixel and the green photon pixel increase at low luminance, and the efficiency of the blue sub-pixel decreases at low luminance. Therefore, it is required to add a photoresistor 412 at least in the pixel driving circuit of the red sub-pixel and the pixel driving circuit of the green sub-pixel so as to realize the red sub-pixel and the green sub-pixel.

Furthermore, since the roll-off phenomenon of the red sub-pixel is more obvious than the roll-off phenomenon of the green sub-pixel, in this embodiment, the resistance value of the photoresistor 412 included in the red sub-pixel may be controlled to be greater than the photoresistor 412 corresponding to the green sub-pixel in the same target pixel unit under the same illumination intensity.

In some embodiments, the target sub-pixel also includes a blue sub-pixel, wherein under the same light intensity, the resistance value of the photoresistor included in the blue sub-pixel is less than the resistance value of the photoresistor 412 corresponding to the red sub-pixel and the resistance value of the photoresistor 412 corresponding to the green sub-pixel in the same the target pixel unit.

In the technical solution of this embodiment, the blue sub-pixel is further taken as the target sub-pixel, and thus by adjusting and controlling photoresistors 412 with different resistance values for sub-pixels in different colors, the consistency of the color change of the sub-pixels in different colors can be improved to help improve the display effect.

In some embodiments, the display substrate includes a display area and a non-display area, the display area has a power supply signal line, the power supply signal line extends in a first direction, the power supply signal line has an input end and an output end located in the non-display area, the target pixel unit includes a first target pixel unit and a second target pixel unit, the distance between the first target pixel unit and the input end of the power supply signal line in the first direction is less than the distance between the second target pixel unit and a target edge of the display substrate.

The first target pixel unit includes first target sub-pixels, the second target pixel unit includes second target sub-pixels, the luminous colors of the first target sub-pixel and the second target sub-pixel are the same, and under the same light intensity, the resistance value of the photoresistor 412 corresponding to the first target sub-pixel is greater than the resistance value of the photoresistor 412 corresponding to the second target sub-pixel.

In this embodiment, the display substrate includes a power supply signal line, and the above-mentioned first direction refers to an extending direction of the power supply signal line. Illustratively, in a certain placed state of the display substrate, the power supply signal line extends along the lateral direction of the display substrate, and then the first direction refers to the lateral direction at this time.

It will be appreciated that due to the resistance of the structure itself, such as the power supply signal line, the actual operating voltage of the pixel units at different locations will be different at a given driving voltage provided, and the difference between the actual operating voltage and the desired driving voltage will be larger as the distance from the input of the power supply signal line increases.

In this embodiment, under the same other conditions, the resistance value of the photoresistor 412 corresponding to the target pixel unit with the greater distance from the target edge is smaller, so as to realize the compensation for the target pixel unit, which helps to improve the consistency of the display effect of the target pixel unit at different positions.

In some embodiments, the display substrate includes a first display area and a second display area, the extension directions of the first display area and the second display area are both the same as the extension direction of the target edge of the display substrate, the distance in the first direction between the first display area and the input end of the power supply signal line is less than the distance between the second display area and the target edge of the display substrate, the pixel units in the first display area are all the first target pixel units, and the pixel units in the second display area are all the second target pixel units.

In this embodiment, the display substrate is divided into a plurality of display areas, where the target pixel unit in the first display area is a first target pixel unit, and the target pixel unit in the second display area is a second target pixel unit. In this way, the adverse effect on the display effect caused by the resistance difference due to the distance between different display areas and the target edge can be reduced, which helps to reduce the possibility of color cast at different display grey scales.

As shown in FIG. 4, in some embodiments, the display substrate includes a base substrate 401, and a driving circuit layer and a light-emitting unit on the base substrate 401. The driving circuit layer may include a buffer layer 402, an active layer 403, a gate insulating layer 404, a gate layer 405, a source and drain metal layer 407, a dielectric layer 406 and a planarization layer 408, and the light-emitting unit includes a first electrode 409, a light-emitting layer 410, and a second electrode 411.

The first electrode 409 includes a first portion 4091 connected to the pixel driving circuit and a second portion 4092 connected to the light-emitting layer, the photoresistor 412 is provided integrally with the first electrode 409, an orthographic projection of the photoresistor 412 onto the base substrate 401 is separated from an orthographic projection of the first portion 4091 onto the base substrate 401, and the orthographic projection of the photoresistor 412 onto the base substrate 401 is separated from an orthographic projection of the second portion 4092 onto the base substrate 401.

Figure 5:
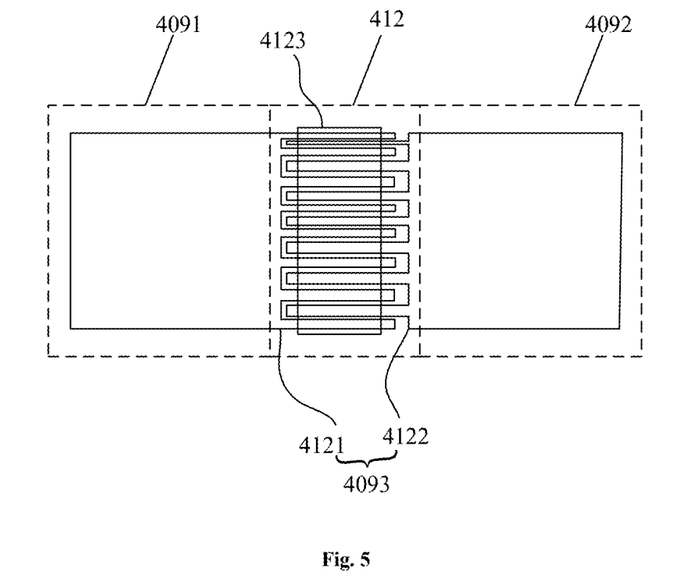
FIG. 5 is a schematic structural diagram of a photoresistor in accordance with an embodiment of the present disclosure.
Figure 6:
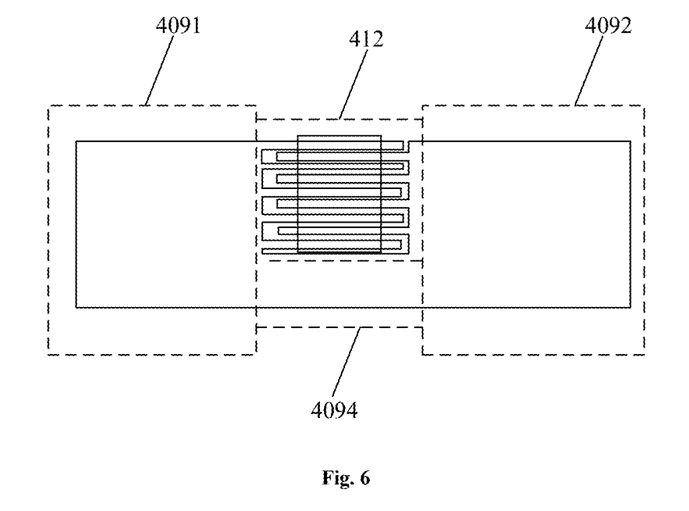
FIG. 6 is another schematic structural diagram of a photoresistor in accordance with an embodiment of the present disclosure.

As shown in FIGS. 5 and 6, an example of the first electrode 409 as the anode of the light-emitting unit, and the second electrode 411 as the cathode of the light-emitting unit is taken for illustration. Generally, the cathode of the light-emitting unit is a common electrode, and therefore, the photoresistor 412 is provided to be connected to the anode of the target sub-pixel in this embodiment, so as to adjust the voltage and current of the light-emitting layer 410 of the target sub-pixel.

As shown in FIGS. 5 and 6, in some embodiments, the first electrode 409 further includes a third portion 4093 positioned between and connected to both the first portion 4091 and the second portion 4092.

As shown in FIG. 5, the third portion 4093 includes a first sub-pattern 4121 and a second sub-pattern 4122 which are arranged at intervals, the first sub-pattern 4121 is connected to the first portion 4091, the second sub-pattern 4122 is connected to the second portion 4092, the first sub-pattern 4121 and the second sub-pattern 4122 are both connected to a photosensitive layer 4123, the resistivity of a photosensitive material of the photosensitive layer 4123 increases as light intensity decreases. Here, the photosensitive layer 4123, the first sub-pattern 4121 and the second sub-pattern 4122 together form the photoresistor 412.

In this embodiment, the photosensitive material of the photosensitive layer 4123 may include one or more of selenium, cadmium sulfide, cadmium selenide, cadmium telluride, gallium arsenide, silicon, germanium, and zinc sulfide, and is formed in a specific region by a process such as deposition or coating. The resistance value of the formed photoresistor 412 may be set according to actual needs. And in this embodiment, it is set as 1 KΩ to 100 KΩ 10 Lux, i.e. in the case of a luminance of 10 Lux, the resistance value of the photoresistor 412 is within a range of from 1 kΩ to 100 kΩ.

As shown in FIGS. 5 and 6, in some embodiments, the first sub-pattern 4121 includes a plurality of first tooth-shaped structures, the second sub-pattern 4122 includes a plurality of second tooth-shaped structures, the first tooth-shaped structures and the second tooth-shaped structures are arranged in a staggered manner, the photosensitive layer 4123 is located on a side of the first electrode 409 away from the base substrate 401, and the orthographic projection of the photosensitive layer 4123 onto the base substrate 401 overlaps both the orthographic projections of the first tooth-shaped structures and the second tooth-shaped structures onto the base substrate 401.

In this embodiment, the first tooth-shaped structures and the second tooth-shaped structures are staggered and covered by the photosensitive layer 4123, so that when the light intensity changes, the material of the photosensitive layer 4123 changes, so that the resistance between the first tooth-shaped structures and the second tooth-shaped structures changes with the light intensity, and at the same time, since the distance between the staggered first tooth-shaped structures and the second tooth-shaped structures is small, it is possible to avoid adverse effects on the display effect caused by excessive fluctuation of the resistance value of the photoresistor 412.

The size of the photoresistor 412 in this embodiment can be controlled by controlling the shape and size of the first tooth-shaped structures and the second tooth-shaped structures. It should be understood that the resistance value of the photoresistor 412 is small when the luminance of the pixel is high and the resistance value of the photoresistor 412 is large when the luminance is low.

In this embodiment, the spacing between the first tooth structures and the second tooth structures may be controlled, and the spacing may be controlled in the range of 0.1-10 microns, and it is apparent that the larger the spacing, the greater the resistance value of the photoresistor 412.

In this embodiment, the thickness and width of the photosensitive layer 4123 may also be controlled, where the thickness refers to the thickness in the direction perpendicular to the base substrate 401, and the width refers to the distance in the direction from the first portion 4091 to the second portion 4092. In this embodiment, the thickness of the photosensitive layer 4123 is controlled to be within a range of 1-1000 nm, and the width is controlled to be within a range of 0.1-20 μm, and the specific dimensions can be set as needed to control the resistance value of the photoresistor 412.

In some embodiments, the orthographic projection of the photosensitive layer 4123 onto the base substrate 401 is separated from an orthographic projection of a part of the first sub-pattern 4121 other than the first tooth-shaped structures onto the base substrate 401, and the orthographic projection of the photosensitive layer 4123 onto the base substrate 401 is separated from an orthographic projection of a part of the second sub-pattern 4122 other than the second tooth-shaped structures onto the base substrate 401.

Thus, in this embodiment, the electrical connection between the first sub-pattern 4121 and the second sub-pattern 4122 can be made only through the photosensitive layer 4123, thereby improving the precise control of the resistance value of the photoresistor 412.

As shown in FIG. 6, in some embodiments, the first electrode 409 further includes a fourth portion 4094 connected to the first portion 4091 and the second portion 4092, and the fourth portion 4094 is connected in parallel with the third portion 4093.

As shown in FIG. 4, in order to prevent the variation range of the resistance value of the photoresistor 412 from being too large, further, in one embodiment, the photoresistor 412 is provided only in a local area of the first electrode 409, so as to improve the regulation accuracy for voltage and current by controlling the resistance variation of the local area.

In some embodiments, the display substrate further includes a pixel definition layer 413 and an opaque isolation structure 4131, where the isolation structure 4131 is arranged in the same layer as the pixel definition layer 413, and the isolation structure 4131 is located on a side of the target sub-pixel corresponding to the photoresistor 412 away from the light-emitting layer 410 of the target sub-pixel.

The isolation structure in this embodiment is used to block light emitted from other sub-pixels to improve the control accuracy of the voltage and current of the target sub-pixel. By providing an isolation structure, the photoresistor 412 is exposed only to the light-emitting unit of the target sub-pixel corresponding to the photoresistor 412, so that the resistance value of the photoresistor 412 is mainly affected by the luminance of the light-emitting unit, and the possible influence of light emitted by other sub-pixels on the resistance value of the photoresistor 412 is reduced, so that during operation, feedback adjustment control on the photoresistor 412 can be realized according to the luminous intensity of the light-emitting unit, improving the current and voltage control effect on the target sub-pixel.

In some embodiments, the length of the first portion 4091 is greater than the length of the third portion 4093 in the direction from the first end to the second end. That is, the photoresistor 412 in this embodiment is closer to the light-emitting unit to improve the detection accuracy of the photoresistor 412 with respect to the luminance, thereby improving the accuracy of the luminance adjustment control for the light-emitting unit.

In some embodiments, the light-emitting layer 410 of the target sub-pixel includes a first surface close to the base substrate 401 and a second surface away from the base substrate 401, an orthographic projection of the first surface onto the base substrate 401 is within an orthographic projection of the second surface onto the base substrate 401. In other words, the area of the orthographic projection of the second surface onto the base substrate 401 is larger than the area of the orthographic projection of the first surface onto the base substrate 401, and the orthographic projection of the second surface onto the base substrate 401 covers the orthographic projection of the first surface onto the base substrate 401.

The orthographic projection of the second surface onto the base substrate 401 and the orthographic projection of the photoresistor 412 corresponding to the target sub-pixel onto the base substrate 401 have an overlapping area, and the orthographic projection of the first surface onto the base substrate 401 and the orthographic projection of the photoresistor 412 corresponding to the target sub-pixel onto the base substrate 401 are separated.

In this embodiment, it can be understood that the interface of the light-emitting layer 410 in the direction perpendicular to the base substrate 401 has a substantially inverted trapezoid shape, and the length of the upper bottom side of the trapezoid is greater than the length of the lower bottom side, so that the first surface of the light-emitting layer 410 covers the photoresistor 412 to a certain extent, so that the photoresistor 412 can be more sufficiently exposed to the light-emitting layer 410, and the detection accuracy of the luminance of the light-emitting layer 410 can be improved when the light-emitting layer 410 emits light.

An embodiment of the present disclosure further provides a display device including the display substrate of any one in the first aspect.

Since the display device of this embodiment includes all the technical solutions of the above-mentioned display substrate embodiments, at least all the above-mentioned technical effects can be achieved, and the description thereof will not be repeated here.

While the present disclosure has been described with reference to specific embodiments thereof, it will be understood by those skilled in the art that various changes may be made and equivalents may be substituted for elements thereof without departing from the scope of the disclosure. Accordingly, the protection sought herein is as set forth in the claims below.

What is claimed is:

1. A display substrate, comprising a base substrate and a plurality of pixel units on the base substrate, wherein each of the pixel units comprises a plurality of sub-pixels, the pixel units comprise a target pixel unit, the target pixel unit comprises target sub-pixels, the target sub-pixel comprises a pixel driving circuit and a light-emitting unit capable of emitting light under the drive of the pixel driving circuit, the target sub-pixel further comprises a photoresistor, the photoresistor is electrically connected to the pixel driving circuit, and the resistance value of the photoresistor increases as light intensity decreases;

wherein the display substrate comprises a display area and a non-display area, the display area has a power supply signal line, the power supply signal line extends in a first direction, the power supply signal line has an input end and an output end located in the non-display area, the target pixel unit comprises a first target pixel unit and a second target pixel unit, the distance between the first target pixel unit and the input end of the power supply signal line in the first direction is less than the distance between the second target pixel unit and a target edge of the display substrate;

wherein the first target pixel unit comprises first target sub-pixels, the second target pixel unit comprises second target sub-pixels, the luminous colors of the first target sub-pixel and the second target sub-pixel are the same, and under the same light intensity, the resistance value of the photoresistor corresponding to the first target sub-pixel is greater than the resistance value of the photoresistor corresponding to the second target sub-pixel.

2. The display substrate according to claim 1, wherein the resistance value of the photoresistor decreases as light intensity increases.

3. The display substrate according to claim 1, wherein the light-emitting unit of the target sub-pixel comprises a first electrode, a second electrode, and a light-emitting layer located between the first electrode and the second electrode, and the material of the light-emitting layer comprises a phosphorescent light-emitting material.

4. The display substrate according to claim 3, wherein the sub-pixels of the pixel unit comprise a red sub-pixel, a green sub-pixel, and a blue sub-pixel, and the target sub-pixel comprises at least one of a red sub-pixel and a green sub-pixel.

5. The display substrate according to claim 4, wherein the target sub-pixel further comprises a blue sub-pixel, wherein under the same light intensity, the resistance value of the photoresistor comprised in the blue sub-pixel is less than the resistance value of the photoresistor corresponding to the red sub-pixel and the resistance value of the photoresistor corresponding to the green sub-pixel in the same target pixel unit.

6. The display substrate according to claim 1, wherein the display substrate comprises a first display area and a second display area, the distance in the first direction between the first display area and the input end of the power supply signal line is less than the distance between the second display area and the target edge of the display substrate, the pixel units in the first display area are all the first target pixel units, and the pixel units in the second display area are all the second target pixel units.

7. The display substrate according to claim 1, wherein a light-emitting unit of the target sub-pixel comprises a first electrode, a light-emitting layer and a second electrode, the first electrode comprises a first portion connected to the pixel driving circuit and a second portion connected to the light-emitting layer, the photoresistor is provided integrally with the first electrode, and an orthographic projection of the photoresistor onto the base substrate is separated from an orthographic projection of the first portion onto the base substrate, and the orthographic projection of the photoresistor onto the base substrate is separated from an orthographic projection of the second portion onto the base substrate.

8. The display substrate according to claim 7, wherein the first electrode further comprises a third portion, the third portion is located between the first portion and the second portion and is connected to both the first portion and the second portion, the third portion comprises a first sub-pattern and a second sub-pattern which are arranged at intervals, the first sub-pattern is connected to the first portion, the second sub-pattern is connected to the second portion, the first sub-pattern and the second sub-pattern are both connected to a photosensitive layer, the resistivity of a photosensitive material of the photosensitive layer increases as light intensity decreases, wherein the photosensitive layer, the first sub-pattern and the second sub-pattern form the photoresistor.

9. The display substrate according to claim 8, wherein the first sub-pattern comprises a plurality of first tooth-shaped structures, the second sub-pattern comprises a plurality of second tooth-shaped structures, the first tooth-shaped structures and the second tooth-shaped structures are arranged in a staggered manner, the photosensitive layer is located on a side of the first electrode away from the base substrate, and an orthographic projection of the photosensitive layer onto the base substrate overlaps with an orthographic projection of the first tooth-shaped structures and the second tooth-shaped structures onto the base substrate.

10. The display substrate according to claim 9, wherein the orthographic projection of the photosensitive layer onto the base substrate is separated from an orthographic projection of a part of the first sub-pattern other than the first tooth-shaped structures onto the base substrate, and the orthographic projection of the photosensitive layer onto the base substrate is separated from an orthographic projection of a part of the second sub-pattern other than the second tooth-shaped structures onto the base substrate.

11. The display substrate according to claim 8, wherein the first electrode further comprises a fourth portion connected to the first portion and the second portion respectively, and the fourth portion is connected in parallel with the third portion.

12. The display substrate according to claim 1, wherein the display substrate further comprises a pixel definition layer located on a side of the first electrode away from the base substrate and an opaque isolation structure, the isolation structure is arranged in the same layer as the pixel definition layer, and the isolation structure is located on a side of the target sub-pixel corresponding to the photoresistor away from the light-emitting layer of the target sub-pixel.

13. The display substrate according to claim 1, wherein the light-emitting layer of the target sub-pixel comprises a first surface close to the base substrate and a second surface away from the base substrate, and an orthographic projection of the first surface onto the base substrate is within an orthographic projection of the second surface onto the base substrate; and the orthographic projection of the second surface onto the base substrate and the orthographic projection of the photoresistor corresponding to the target sub-pixel onto the base substrate have an overlapping area, and the orthographic projection of the first surface onto the base substrate and the orthographic projection of the photoresistor corresponding to the target sub-pixel onto the base substrate are separated.

14. A display device comprising a display substrate, the display substrate comprising a base substrate and a plurality of pixel units on the base substrate, wherein each of the pixel units comprises a plurality of sub-pixels, the pixel units comprise a target pixel unit, the target pixel unit comprises target sub-pixels, the target sub-pixel comprises a pixel driving circuit and a light-emitting unit capable of emitting light under the drive of the pixel driving circuit, the target sub-pixel further comprises a photoresistor, the photoresistor is electrically connected to the pixel driving circuit, and the resistance value of the photoresistor increases as light intensity decreases;

wherein the display substrate comprises a display area and a non-display area, the display area has a power supply signal line, the power supply signal line extends in a first direction, the power supply signal line has an input end and an output end located in the non-display area, the target pixel unit comprises a first target pixel unit and a second target pixel unit, the distance between the first target pixel unit and the input end of the power supply signal line in the first direction is less than the distance between the second target pixel unit and a target edge of the display substrate;

wherein the first target pixel unit comprises first target sub-pixels, the second target pixel unit comprises second target sub-pixels, the luminous colors of the first target sub-pixel and the second target sub-pixel are the same, and under the same light intensity, the resistance value of the photoresistor corresponding to the first target sub-pixel is greater than the resistance value of the photoresistor corresponding to the second target sub-pixel.

15. The display device according to claim 14, wherein the resistance value of the photoresistor decreases as light intensity increases.

16. The display device according to claim 14, wherein the light-emitting unit of the target sub-pixel comprises a first electrode, a second electrode, and a light-emitting layer located between the first electrode and the second electrode, and the material of the light-emitting layer comprises a phosphorescent light-emitting material.

17. The display device according to claim 16, wherein the sub-pixels of the pixel unit comprise a red sub-pixel, a green sub-pixel, and a blue sub-pixel, and the target sub-pixel comprises at least one of a red sub-pixel and a green sub-pixel.

18. The display device according to claim 17, wherein the target sub-pixel further comprises a blue sub-pixel, wherein under the same light intensity, the resistance value of the photoresistor comprised in the blue sub-pixel is less than the resistance value of the photoresistor corresponding to the red sub-pixel and the resistance value of the photoresistor corresponding to the green sub-pixel in the same target pixel unit.

* * * * *